United States Patent
Lee et al.

(10) Patent No.: US 9,129,975 B2
(45) Date of Patent: Sep. 8, 2015

(54) METHOD OF FORMING A THIN SUBSTRATE CHIP SCALE PACKAGE DEVICE AND STRUCTURE

(71) Applicant: Amkor Technology, Inc., Chandler, AZ (US)

(72) Inventors: Kyoung Yeon Lee, Gyeonggi-do (KR); Byong Jin Kim, Gyeonggi-do (KR); Gi Jeong Kim, Gyeonggi-do (KR)

(73) Assignee: Amkor Technology, Inc., Tempe, AZ (US)

( * ) Notice: Subject to any disclaimer, the term of this patent is extended or adjusted under 35 U.S.C. 154(b) by 9 days.

(21) Appl. No.: 13/750,022

(22) Filed: Jan. 25, 2013

(65) Prior Publication Data

US 2013/0277815 A1    Oct. 24, 2013

(30) Foreign Application Priority Data

Apr. 19, 2012    (KR) .................... 10-2012-0040673

(51) Int. Cl.
| | |
|---|---|
| *H01L 23/495* | (2006.01) |
| *H01L 21/56* | (2006.01) |
| *H01L 21/48* | (2006.01) |
| *H01L 29/06* | (2006.01) |
| *H01L 23/31* | (2006.01) |

(52) U.S. Cl.
CPC ............ *H01L 21/56* (2013.01); *H01L 21/4832* (2013.01); *H01L 23/495* (2013.01); *H01L 29/0657* (2013.01); *H01L 23/3107* (2013.01); *H01L 2224/16245* (2013.01); *H01L 2224/48091* (2013.01); *H01L 2224/48247* (2013.01)

(58) Field of Classification Search
CPC .............................. H01L 23/495; H01L 21/56
See application file for complete search history.

(56) References Cited

U.S. PATENT DOCUMENTS

| | | | | |
|---|---|---|---|---|
| 7,476,972 | B2 * | 1/2009 | Takahashi | 257/773 |
| 2008/0191324 | A1 * | 8/2008 | Qiao et al. | 257/666 |
| 2013/0056703 | A1 * | 3/2013 | Elian et al. | 257/9 |

FOREIGN PATENT DOCUMENTS

| | | |
|---|---|---|
| KR | 1020090085258 A | 8/2009 |
| KR | 1020110048955 A | 5/2011 |
| KR | 1020120031681 A | 4/2012 |

OTHER PUBLICATIONS

Office Action received from Korean Patent Office in Korean; English Translation Not Available; Date: Sep. 5, 2013; 4 pages.

* cited by examiner

*Primary Examiner* — Thanh V Pham
(74) *Attorney, Agent, or Firm* — Kevin B. Jackson (57) ABSTRACT

In one embodiment, a method for forming an electronic package structure includes providing a single unit leadframe having first terminals on a first or top surface. An electronic device is attached to the single unit leadframe and electrically connected to the first terminals. The leadframe, first terminals, and the electronic device are encapsulated with an encapsulating material. Second terminals are then formed by removing portions of a second or bottom surface of the leadframe. In one embodiment, the method can be used to fabricate a thin substrate chip scale package ("tsCSP") type structure.

19 Claims, 9 Drawing Sheets

METHOD OF FORMING A THIN SUBSTRATE CHIP SCALE PACKAGE DEVICE AND STRUCTURE

CROSS REFERENCE TO RELATED APPLICATIONS

This application claims priority to Korean Patent Application No. 10-2012-0040673 filed on Apr. 19, 2012, which is expressly incorporated by reference herein.

BACKGROUND

The present invention relates to electronic devices, and more specifically to electronic device package structures and methods of fabricating the same.

Electronic devices, such as semiconductor dies are conventionally enclosed in plastic packages that protect the semiconductor die from hostile environments and that enable electrical interconnection between the semiconductor die and a next level of assembly, such as a printed circuit board (PCB) or motherboard. The elements of a typical electronic package include a conductive leadframe or substrate, an integrated circuit or semiconductor die, conductive structures, such as bond wires or solder balls that electrically connect pads on the semiconductor die to individual leads of the leadframe or substrate; and a hard plastic encapsulant material that covers the other components and forms an exterior of the semiconductor package commonly referred to as the package body. Portions of the individual leads can be exposed to electrically connect the package to the next level assembly.

Chip scale packaging ("CSP") is one packaging technique currently used to support end-user demands for increased integration and increased functionality coupled with demands for thinner and smaller footprint packages. One type of CSP device is referred to as a thin substrate CSP device or tsCSP device. FIGS. 3A to 3E show cross-sectional views of a known manufacturing process for fabricating tsCSP style devices.

Figure 3A:
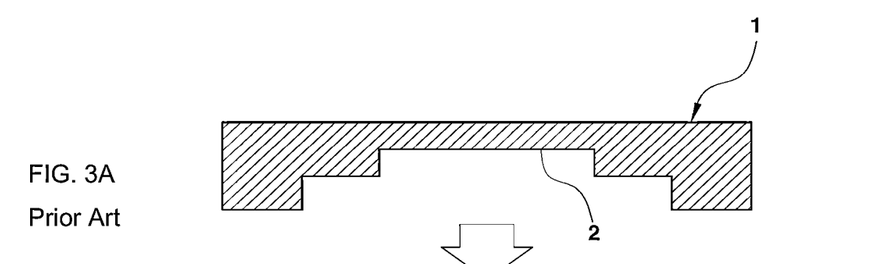
FIGS. 3A to 3E show cross-sectional views of a related thin substrate chip scale package structure at sequential stages of manufacture.

As shown in FIG. 3A, a cavity 2 is formed in a dual stepped manner on a bottom surface of a leadframe 1. Next, cavity 2 of leadframe 1 is filled with a dielectric material 3 so that a bottom surface of dielectric material 3 is coplanar with the bottom surface of leadframe 1 as shown in FIG. 3B.

Figures 3B, 3C:
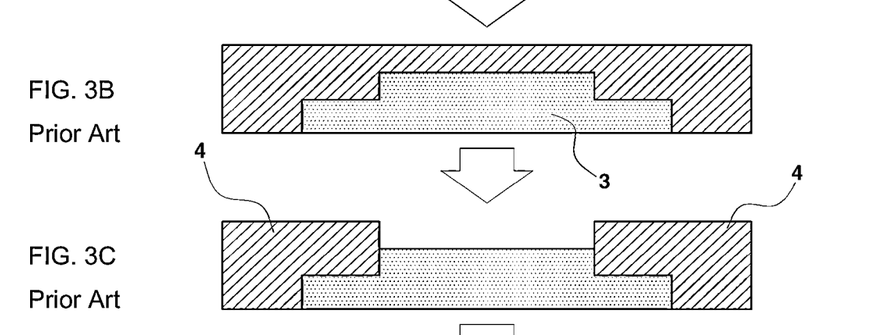

Subsequently, an etching process is used to form a desired pattern on the top surface of leadframe 1, as shown in FIG. 3C. During the etching process, portions of the top and side surfaces of leadframe 1 are removed to form multiple independent terminals 4 having a predetermined pattern or array. Dielectric material 3 insulates the independent terminals 4 from each other.

Figure 3D:
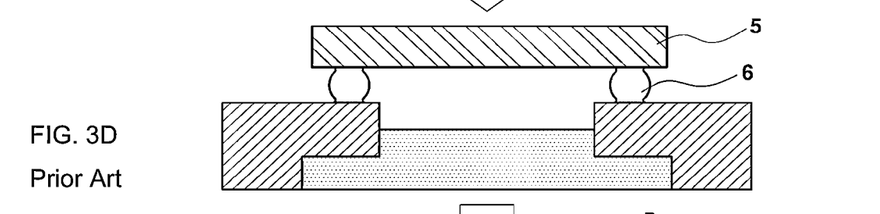
Figure 3E:
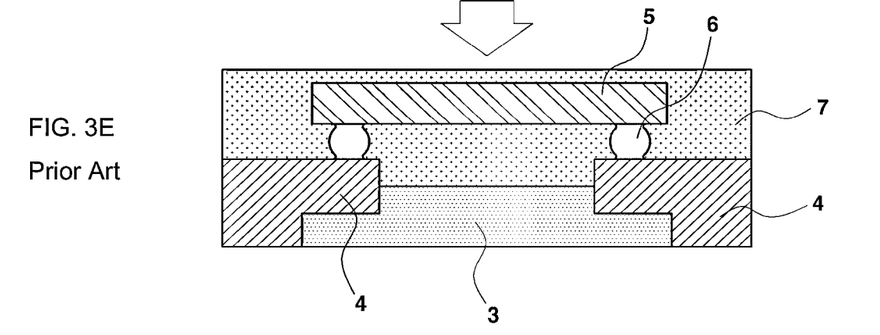

Next, as shown in FIG. 3D, bond pads on a semiconductor chip 5 are attached to independent terminals 4 on the top surface of leadframe 1 using conductive bumps 6. Thereafter, the structure is placed into a molding apparatus and the structure is molded with a molding compound resin 7 as shown in FIG. 3E. Molding compound resin 7 encapsulates semiconductor chip 5 as well as the top surface of leadframe 1. In the completed tsCSP device, independent terminals 4 are exposed through a bottom surface thereof to be mounted to a next level of assembly.

The conventional tsCSP fabrication method of FIGS. 3A-E has several disadvantages. First, the very thin leadframe is very difficult to handle during the etching process and the independent terminals are left unsupported except for the insulation material, which has been found to be very limited and ineffective. The handling problems also affect the step of mounting the semiconductor chip to the independent terminals and the external forces have been found to cause breakage and other failure mechanisms.

Second, because the independent terminals, the insulating material, and the semiconductor chip have different thermal expansion coefficients, warpage has been found to occur during the molding step. This has resulted in delamination, which can occur, for example, at interfaces between the independent terminals and the insulating material.

Third, in the conventional process the independent terminals are etched before the steps of mounting the semiconductor chip and molding the structure. External forces can cause the location of the independent terminals to deviate from desired positions making alignment and placement of the semiconductor chip onto the independent terminals difficult. This can detrimentally impact process cycle time and device reliability.

Accordingly, it is desirable to have a structure and method for forming electronic device package structures including CSP structures and tsCSP structures that address the issues set forth above as well as others.

For simplicity and clarity of the illustration, elements in the figures are not necessarily drawn to scale, and the same reference numbers in different figures denote the same elements. Additionally, descriptions and details of well-known steps and elements are omitted for simplicity of the description.

DETAILED DESCRIPTION OF THE DRAWINGS

Figure 1A:
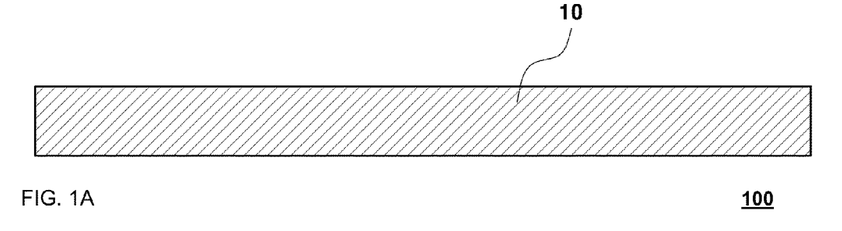
FIGS. 1A to 1H illustrate cross-sectional views an electronic package according to an embodiment of the present invention at various stages of fabrication.

FIGS. 1A to 1H illustrate cross-sectional views of an electronic package structure 100, such as a semiconductor package at various stages of fabrication in accordance with a first embodiment. In one embodiment, electronic package structure 100 includes a single unit leadframe 10 having a predetermined thickness as illustrated in FIG. 1A. In one embodiment, leadframe 10 can be a conductive material such as a metal, a metal alloy, a material electroplated with a conductive material, or similar material as known by one of ordinary skill in the art.

Figure 1B:
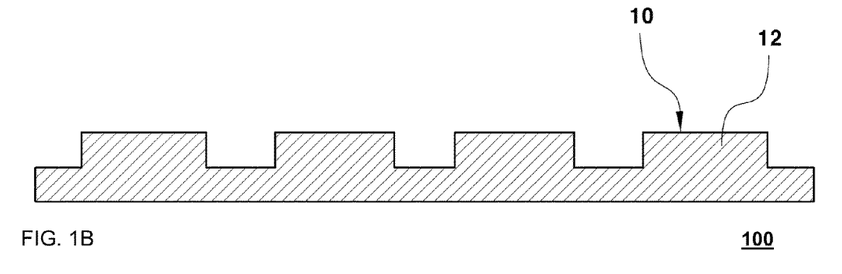

Portions of a top surface of single unit leadframe 10 are removed to form a plurality of terminals or terminals 12 that have a desired pattern and that protrude upward from remaining portions of single unit leadframe 10 as illustrated in FIG. 1B. In one embodiment, a first or top surface of single unit leadframe 10 is covered by a mask, such as photoresist, and portions of the top surface are etched away in etch solution thereby forming terminals 12 having the desired pattern and protruding from the top surface of single unit leadframe 10.

Figure 1C:
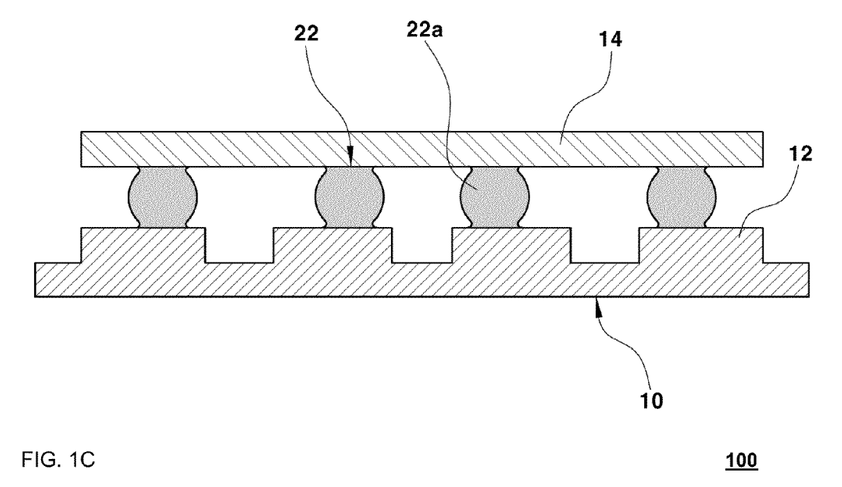

In one embodiment, an electronic device such as, a semiconductor chip 14 is attached to terminals 12, as illustrated in FIG. 1C. In accordance with one embodiment, conductive structures or conductive input/output terminals 22 electrically connect bond pads on semiconductor chip 14 to terminals 12. In one embodiment, input/output terminals 22 are configured as conductive bumps 22a. In one embodiment, conductive bumps 22*a* allow the bonding pads of semiconductor chip 14 to be conductively attached or welded to each of the respective terminals 12 of single unit leadframe 10 by a reflow process.

Figure 1D:
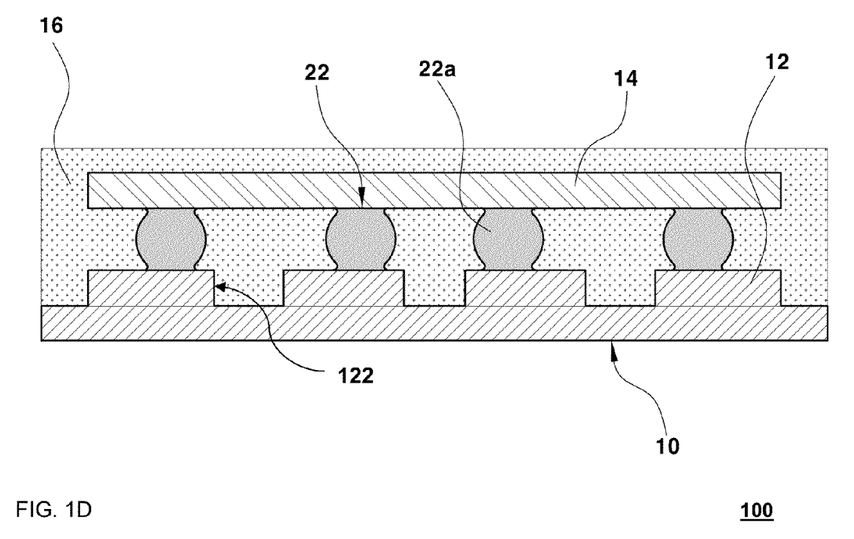

FIG. 1D illustrates a cross-sectional view of electronic package structure 100 after further processing. In one embodiment, a molding compound resin or encapsulating layer 16 can be molded throughout the top surface of single unit leadframe 10 to encapsulate semiconductor chip 14 and conductive input/output members 22. In one embodiment, molding compound resin 16 completely covers side surfaces 122 of terminals 12 as illustrated in FIG. 1D, which is different than the previous device shown in FIG. 3E where resin layer 7 can only partially cover the side surfaces terminals 4 because other portions of the side surfaces of terminals 4 are covered by dielectric material 3. Stated another way, side surfaces 122 of terminals 12 are devoid of an insulating layer as illustrated in FIG. 1D.

In contrast to previous methods where the separated terminals are formed by etching the leadframe before mounting and encapsulating the semiconductor chip, the mounting of semiconductor chip 14 and the molding by molding compound resin 16 are performed without separating single unit lead frame 10 into independent terminals, which improves the handling efficiency between processing steps. Also, the method in accordance with the present embodiment minimizes the effects caused by the separated terminals deviating from desired locations before the semiconductor chip mounting step as found in the previous method. In addition, because terminals 12 of single unit leadframe 10 are simultaneously connected to semiconductor chip 14 and still connected together during the molding step, the previous issues of interface delamination due to warpage can be reduced.

Figure 1E:
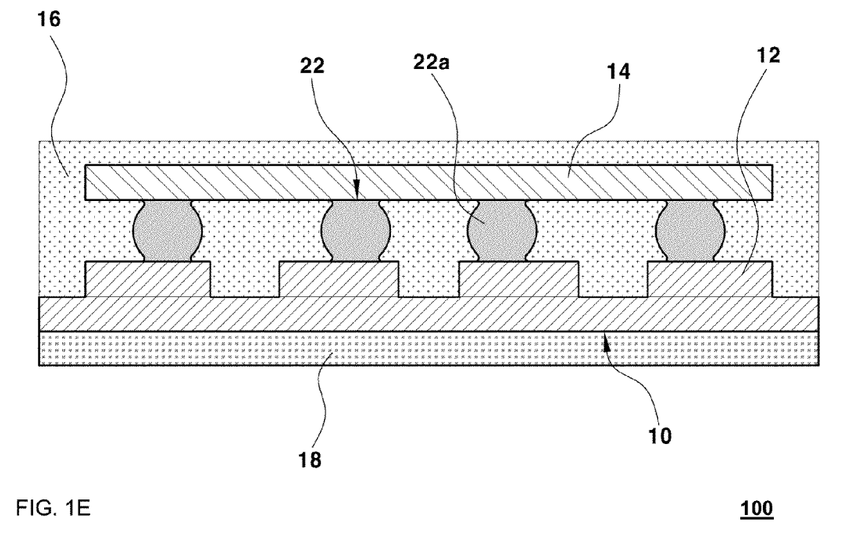

FIGS. 1E to 1H illustrate cross-sectional views of electronic package structure 100 after further processing of single unit leadframe 10 to form independent terminals or terminals 20. In one embodiment, portions of a second or bottom surface single unit leadframe 10 can be removed to form terminals 20 using photoresist and etch process. In one embodiment, a layer of photoresist 18 is attached to or formed on the bottom surface of single unit leadframe 10 as illustrated in FIG. 1E.

Figure 1F:
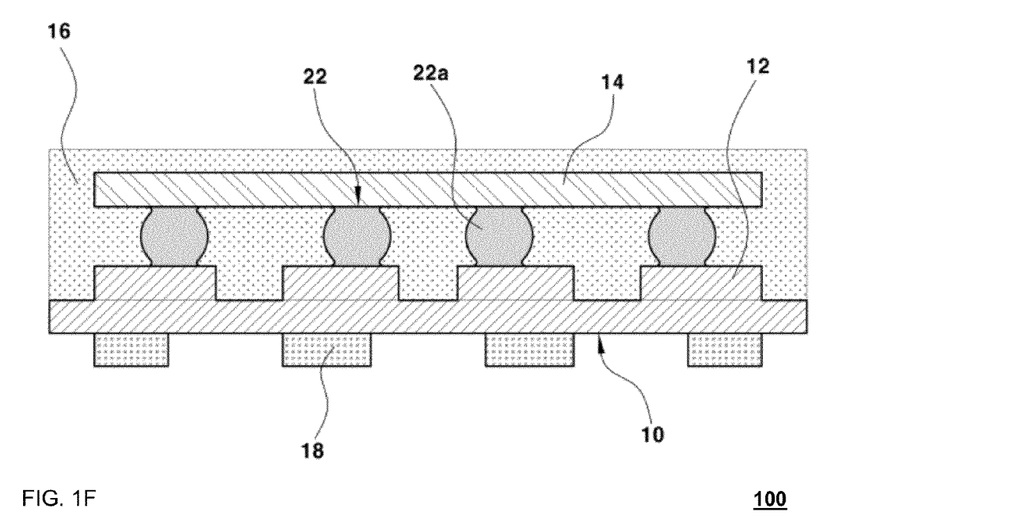
Figure 1G:
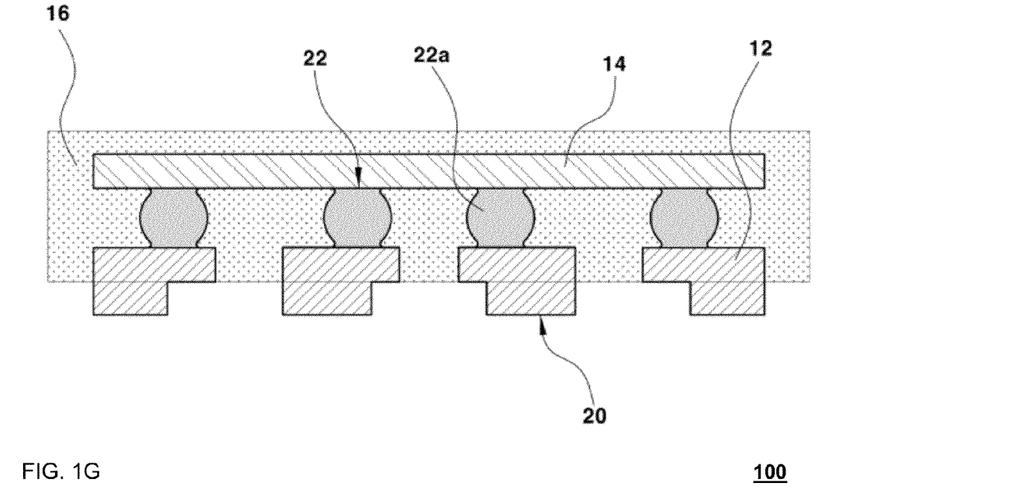

Subsequently, photoresist 18 can be exposed and developed leaving a desired pattern protecting or covering portions of the bottom surface of single unit leadframe 10 where terminals 20 are to be formed, as illustrated in FIG. 1F. This step leaves portions of the bottom surface of single unit leadframe 10 exposed, and these exposed portions can then be removed or etched away to form independent terminals 20, as illustrated in FIG. 1G. Photoresist layer 18 can then be removed. In the present embodiment, independent terminals 20 are formed after the molding. Independent terminals 20 are configured for attachment to a next level of assembly. In one embodiment, the removal step to form independent terminals 20 can expose portions of terminals 12 through molding compound resin 16, as illustrated in FIG. 1G.

Figure 1H:
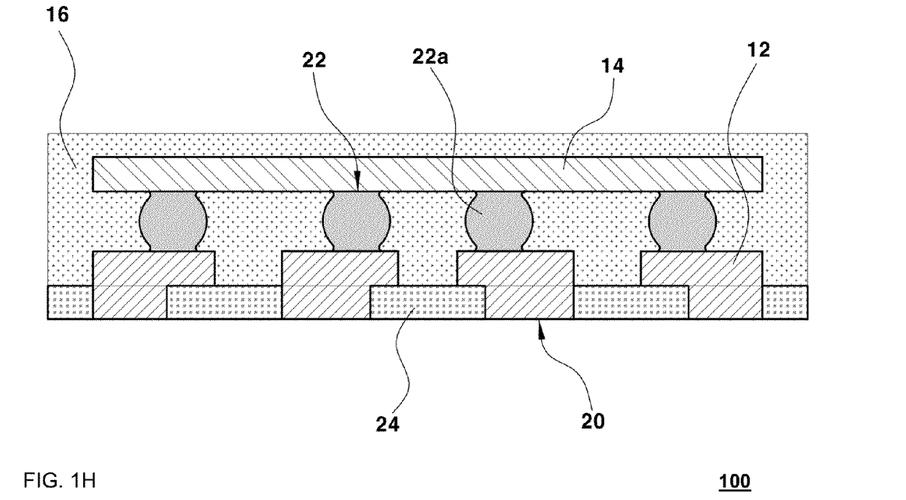

In an optional step, an insulating material 24, such as an epoxy resin, a solder resist or a molding compound resin, can be placed or filled in spaces formed between independent terminals 20 as illustrated in FIG. 1H. This step can be used to planarize the bottom surface of electronic package structure 100 and to further insulate independent terminals 20 from each other. In this configuration, independent terminals 20 can be attached to a next level of assembly using, for example, solder balls or solder bumps.

FIGS. 2A to 2I are cross-sectional views of an electronic package structure 200, such as a semiconductor package at various stages of fabrication in accordance with another embodiment. In one embodiment, electronic package structure 200 has a configuration similar to electronic package structure 100 and is fabricated in similar manner. However, electronic package structure 200 is different than electronic package structure 100 because conductive wires 22*b* are used as conductive input/output members 22 connecting semiconductor chip 14 to single unit leadframe 10.

Figure 2A:
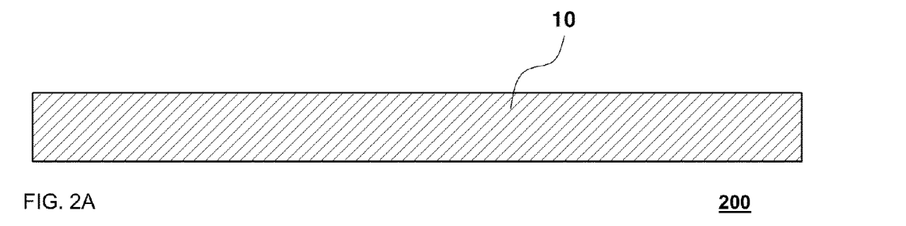
FIGS. 2A to 2I illustrates cross-sectional views of an electronic package according to another embodiment of the present invention at various stages of fabrication.
Figure 2B:
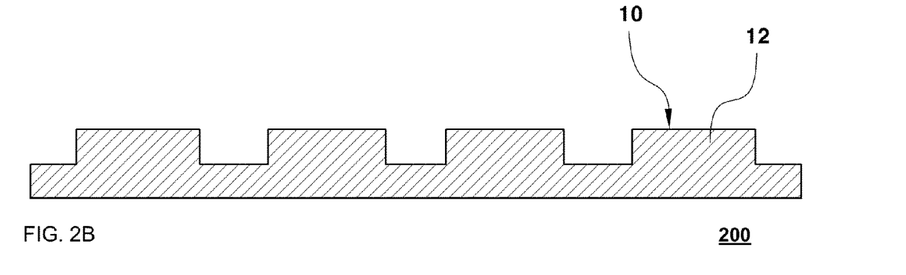
Figure 2C:
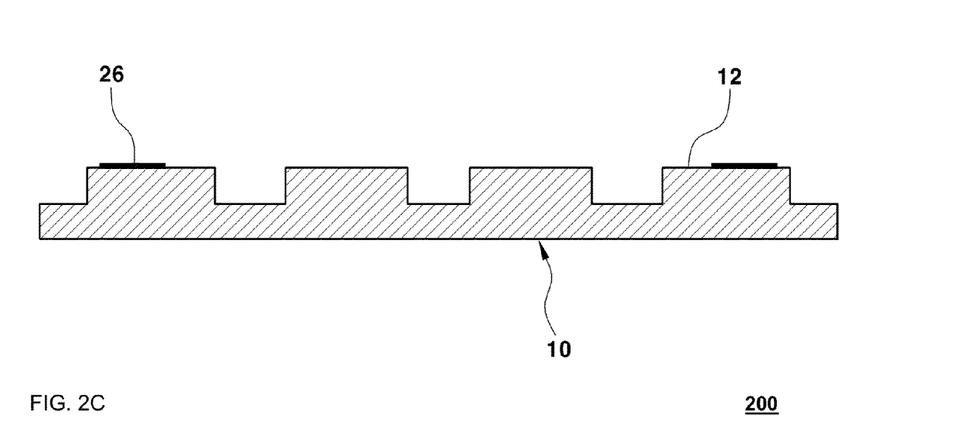

In one embodiment, electronic package structure 200 includes single unit leadframe 10 having a predetermined thickness as illustrated in FIG. 2A. Terminals 12 can formed to protrude from the top surface of single unit leadframe as illustrated in FIG. 2B and further described in conjunction with FIG. 1B. In accordance with the present embodiment, bonding layers or plated layers 26 can be formed on some of terminals, as illustrated in FIG. 2C to facilitate the using of bonding wires 22*b*. In one embodiment, terminals 12 can be made of copper, and layers of gold (Au) and nickel (Ni) can be sequentially formed or plated onto surfaces of terminals 12 to form bonding layers 26. In another embodiment, layer of silver (Ag) can formed or plated onto surfaces of terminal 12 to form bonding layers 26.

Figure 2D:
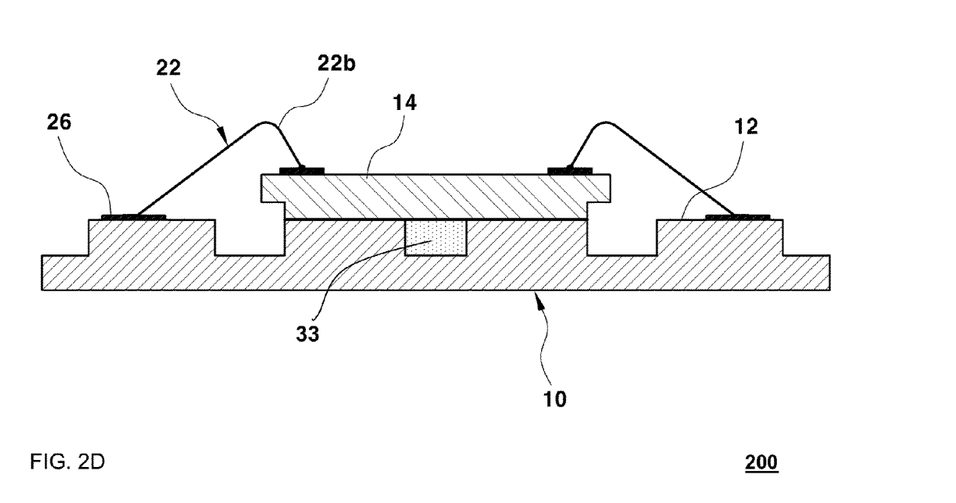
Figure 2E:
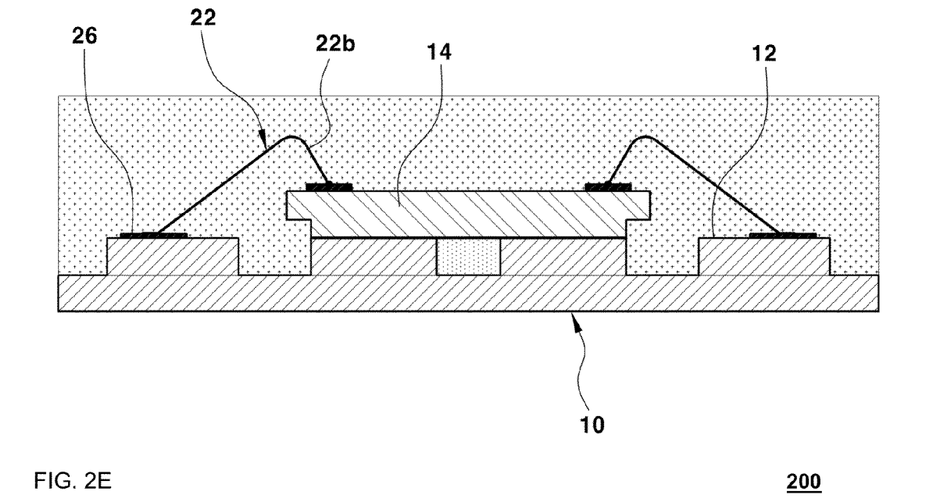
Figure 2F:
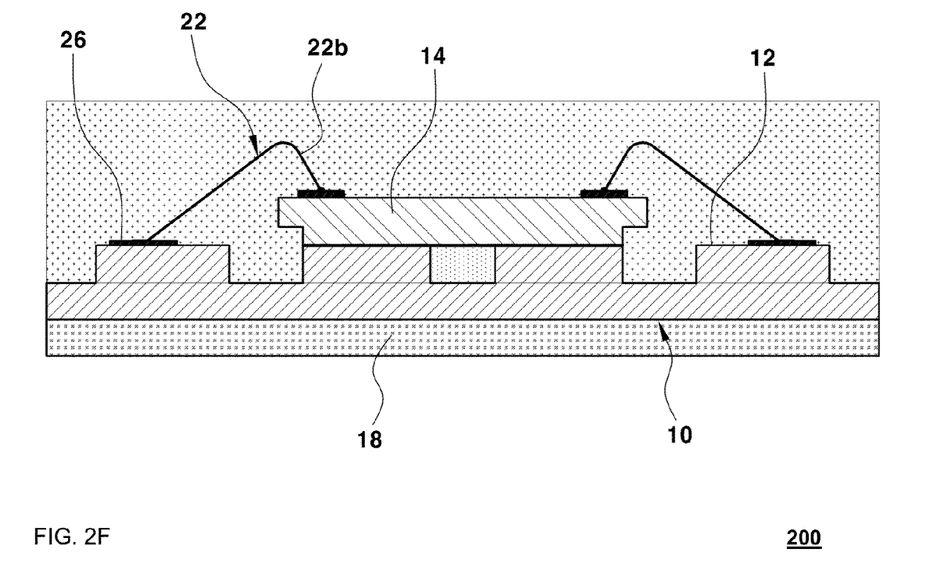
Figure 2G:
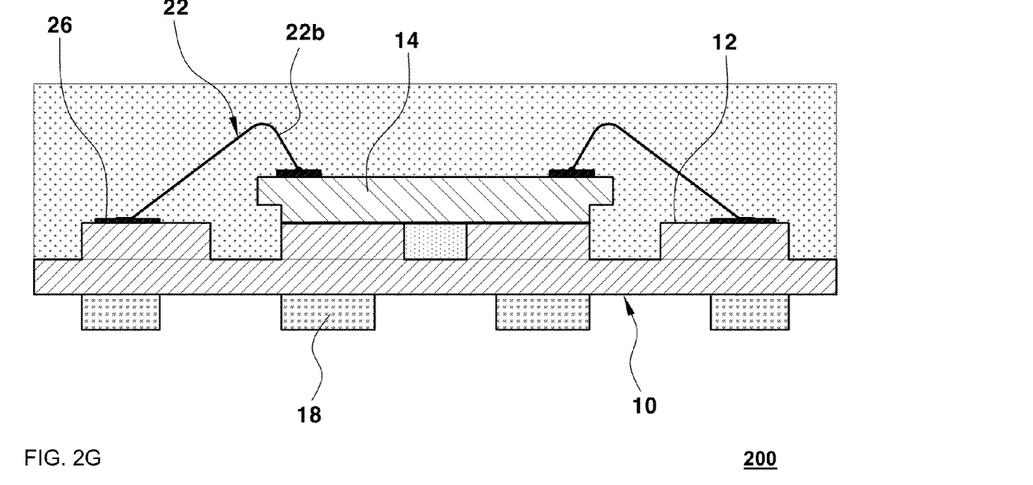
Figure 2H:
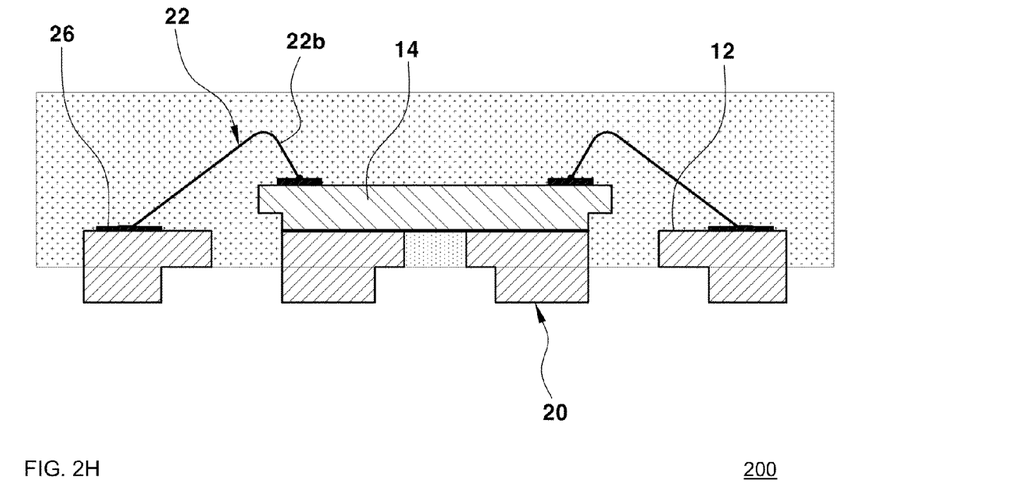
Figure 2I:
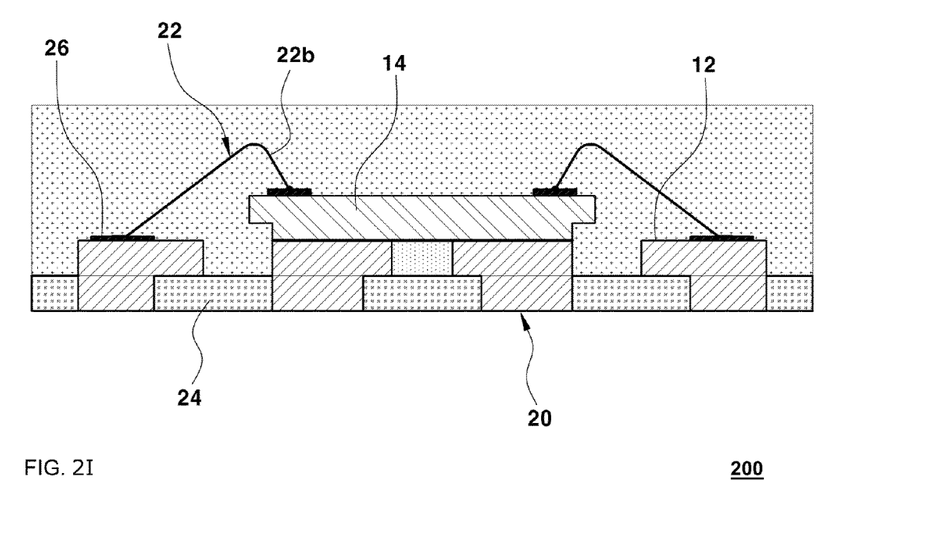

Subsequently, semiconductor chip 14 is attached to single unit leadframe 10 using, for example, an adhesive material 33, and conductive wires 22*b* are attached to bonding pads on semiconductor chip 14 to bonding layers 26 on terminals 12, as illustrated in FIG. 2D. Molding compound resin 16 is then molded throughout the top surface of single unit leadframe 10 to encapsulate semiconductor chip 14 and conductive wire 22*b*, as illustrated in FIG. 2E.

Similar to the method used to form electronic package structure 100, the method in accordance with the present embodiment includes the steps of mounting of the semiconductor chip 14 and molding by molding compound resin 16 before single unit leadframe 10 is separated into independent terminals 20. Thus, handling efficiency between processing steps is improved. Also, the method in accordance with the present embodiment minimizes the effects caused by the separated terminals deviating from desired locations before the semiconductor chip mounting step as found in the previous method. In addition, because terminals 12 of single unit leadframe 10 are simultaneously connected to semiconductor chip 14 and are still connected together during the molding step, the previous issues of interface delamination due to warpage can be reduced.

FIGS. 2F to 2I illustrate cross-sectional views of electronic package structure 200 after further processing of single unit leadframe 10 to form independent terminals or terminals 12. In one embodiment, terminals 12 are formed in electronic package 200 in a similar manner, as described in conjunction with FIGS. 1E to 1H.

From all of the foregoing, one skilled in the art can determine that according to one embodiment, a method for forming an electronic package structure (for example, elements 100, 200) includes providing a single unit leadframe (for example, element 10) having first terminals (for example, element 12) protruding in a predetermined array on a first surface. The method includes attaching an electronic chip (for example, element 14) to the first surface. The method includes forming an encapsulating layer (for example, element 16) on the first surface to encapsulate the electronic chip. The method includes removing portions of a second surface of the single unit leadframe to form independent terminals (for example, element 20) on the second surface.

Those skilled in the art will also appreciate that, according to another embodiment, a method of forming a semiconductor package structure (for example, elements 100, 200)

includes comprising providing a single unit leadframe (for example, element 10) having first terminals (for example, element 12) protruding from a first surface. The method includes attaching a semiconductor chip (for example, element 14) to the first terminals. The method includes encapsulating the semiconductor chip and the first surface with encapsulating layer (for example, element 16). The method includes thereafter removing portions of a second surface of the single unit leadframe opposite to the first surface to form independent terminals (for example, elements 20) electrically coupled to the first terminals.

Those skilled in the art will also appreciate that according to a further embodiment, an electronic package structure (for example, elements 100, 200) a leadframe (for example, element 10) having first terminals (for example element 12) defining a first surface and second terminals defining a second surface, wherein the first terminals and the second terminals are connected together in a predetermined pattern. An electronic chip (for example, element 14) is attached to the first surface and electrically coupled to the first terminals (for example, elements 22, 22*a*, 22*b*). An encapsulating layer (for example, element 16) covers the electronic chip and the first terminals including side surfaces (for example, element 120) thereof.

In view of all the above, it is evident that a novel method and structure is disclosed. Included, among other features, is a single unit leadframe having first terminals formed to protrude from a first surface of the single unit leadframe. An electronic chip is then attached to the single unit leadframe and electrically connected to the first terminals. The electronic chip and first terminals are covered with an encapsulant. Portions of the second surface of the single unit leadframe are then removed to form independent terminals, which are electrically connected to the first terminals. The method and structure reduce handling problems associated with prior methods. The method and structure also reduce alignment problems during the chip attachment process associated with prior methods, and further reduce problems associated with delamination between the encapsulating layer and the leadframe.

While the subject matter of the invention is described with specific preferred embodiments and example embodiments, the foregoing drawings and descriptions thereof depict only typical embodiments of the subject matter, and are not therefore to be considered limiting of its scope. It is evident that many alternatives and variations will be apparent to those skilled in the art. For example, the subject matter has been described for semiconductor devices; however the method and structure is directly applicable to other electronic devices, such as optoelectronic devices, sensor devices, imaging devices, solar cells, medical devices, and other devices configured for and/or benefited by package structures.

As the claims hereinafter reflect, inventive aspects may lie in less than all features of a single foregoing disclosed embodiment. Thus, the hereinafter expressed claims are hereby expressly incorporated into this Detailed Description of the Drawings, with each claim standing on its own as a separate embodiment of the invention. Furthermore, while some embodiments described herein include some but not other features included in other embodiments, combinations of features of different embodiments are meant to be within the scope of the invention, and form different embodiments, as would be understood by those skilled in the art.

What is claimed is:

1. A method for forming an electronic package structure comprising:

providing a single unit leadframe having first terminals protruding in a first predetermined array on a first surface, the first terminals separated by a plurality of grooves;

placing an adhesive within a first groove, wherein the adhesive is absent from a second groove;

attaching an electronic chip to the first surface with the adhesive, wherein the electronic chip overlaps the first groove;

forming an encapsulating layer on the first surface to encapsulate the electronic chip, wherein the encapsulating layer is within the second groove; and removing portions of a second surface of the single unit leadframe to form second terminals in a second predetermined array on the second surface and coupled to the first terminals, wherein the first predetermined array is different than the second predetermined array.

2. The method of claim 1, wherein attaching the electronic chip comprises:

attaching the electronic chip to the first surface; and attaching conductive structures to bond pads on the electronic chip and to the first terminals.

3. The method of claim 1, wherein removing portions of the second surface of the single unit leadframe includes exposing a surface of the adhesive, the method further comprising forming an insulating layer in spaces between the second terminals, wherein the insulating layer adjoins the exposed surface of the adhesive layer.

4. The method of claim 1, wherein forming the encapsulating layer includes forming the encapsulating layer to completely cover side surfaces of the first terminals.

5. The method of claim 1, wherein removing portions of the second surface includes forming the second terminals such that the first terminals are wider than the second terminals.

6. The method of claim 1, wherein removing portions of the second surface comprises:

forming a photoresist layer on the second surface;

patterning the photoresist layer to expose portions of the second surface; and etching the exposed portions of the second surface.

7. The method of claim 1 further comprising forming an insulating layer in spaces between the second terminals.

8. The method of claim 1, wherein providing the single unit leadframe comprises:

forming a patterned mask on the first surface; and removing exposed portions of the first surface to form the first terminals.

9. The method of claim 1 further comprising forming a bonding layers on at least a portion of the first terminals.

10. The method of claim 1, wherein attaching the electronic chip comprises electrically connecting opposing major surfaces of the electronic chip to the first terminals.

11. A method of forming a semiconductor package structure comprising:

providing a single unit leadframe having first terminals protruding from a first surface in a first predetermined array, wherein the first predetermined array includes a first groove and a second groove;

attaching a semiconductor chip to the single unit leadframe with an adhesive layer in the first groove absent from the second groove, wherein the semiconductor chip overlaps the first groove, wherein opposing major surfaces of the semiconductor chip are electrically connected to the single unit leadframe;

encapsulating the semiconductor chip and the first surface with an encapsulating layer, the encapsulating layer being within the second groove but not the first groove;

thereafter removing portions of a second surface of the single unit leadframe opposite to the first surface to form second terminals in a second predetermined array on the second surface and electrically coupled to the first terminals, wherein the removing step exposes a surface of the adhesive; and forming an insulating layer in spaces between the second terminals, wherein the insulating layer adjoins the exposed surface of the adhesive layer.

12. The method of claim 11, wherein removing portions of the second surface comprises:

forming a masking layer on the second surface leaving portions of the second surface exposed; and etching the second surface to form the second terminals.

13. The method of claim 12, wherein forming the masking layer includes forming a photoresist layer.

14. The method of claim 11, wherein attaching the semiconductor chip includes attaching bond pads on the semiconductor chip to the first terminals using conductive structures.

15. The method of claim 14, wherein attaching the semiconductor chip includes attaching the bond pads to the first terminals with conductive wires.

16. The method of claim 11, wherein removing portions of the second surface compromises removing portions of the second surface to form a thin substrate chip scale package structure, and wherein removing portions of the second surface comprises providing the second predetermined array different than the first predetermined array, wherein at least some of the first terminals are wider than the second terminals.

17. A method for forming a thin substrate chip scale package electronic device comprising:

providing a leadframe comprising a conductive material and having a plurality of upper terminal portions protruding from a first surface in a first predetermined pattern, the first predetermined pattern including a plurality of grooves between the upper terminal portions, the leadframe further comprising a generally planar second surface opposed to the first surface;

placing an adhesive within a first groove, wherein the adhesive is absent from at least a second groove;

attaching an electronic device to the adhesive and electrically coupled to the upper terminal portions;

forming a molded encapsulating layer covering the electronic device, portions of the first surface between the upper terminal portions, and side surfaces of the upper terminal portions, wherein the molded encapsulating layer is within the second groove but not within the first groove;

thereafter removing portions of the leadframe from the second surface in a second predetermined pattern to provide a plurality of lower terminal portions connected to the upper terminal portions with spaces between the plurality of lower terminal portions, wherein the second predetermined pattern is different than the first predetermined pattern, wherein removing portions of the leadframe from the second surface includes exposing portions of the molded encapsulating layer and a portion of the adhesive; and providing an insulating layer within the spaces, wherein the insulating layer adjoins the adhesive.

18. The method of claim 17, wherein:

providing the leadframe comprises:

forming a masking layer on the leadframe having the first predetermined pattern, and partially etching portions of the leadframe to form the plurality of upper terminal portions and the plurality of grooves; and providing the insulating layer comprises forming a resin material within the spaces.

19. The method of claim 17, wherein attaching the electronic device to the adhesive and electrically coupled to the upper terminal portions comprises electrically connecting opposing major surfaces of the electronic device to the upper terminal portions.

\* \* \* \* \*